United States Patent
Ma et al.

(10) Patent No.: US 10,171,634 B2
(45) Date of Patent: Jan. 1, 2019

(54) STATE TRANSITION METHOD AND APPARATUS BASED ON ROHC, AND STORAGE MEDIUM

(71) Applicant: ZTE CORPORATION, Guangdong (CN)

(72) Inventors: Debao Ma, Guangdong (CN); Jianjun Dong, Guangdong (CN); Jian Wu, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 320 days.

(21) Appl. No.: 15/036,575

(22) PCT Filed: Jun. 9, 2014

(86) PCT No.: PCT/CN2014/079546
§ 371 (c)(1),
(2) Date: Jun. 2, 2016

(87) PCT Pub. No.: WO2014/183719
PCT Pub. Date: Nov. 20, 2014

(65) Prior Publication Data
US 2016/0301776 A1    Oct. 13, 2016

(30) Foreign Application Priority Data
Nov. 15, 2013    (CN) .......................... 2013 1 0576477

(51) Int. Cl.
*H04L 29/06* (2006.01)
*H03M 7/30* (2006.01)

(52) U.S. Cl.
CPC .............. *H04L 69/04* (2013.01); *H03M 7/30* (2013.01); *H03M 7/6011* (2013.01);
(Continued)

(58) Field of Classification Search
CPC ....... H04L 69/04; H04L 69/161; H04L 69/22; H03M 7/30; H03M 7/6011; H03M 7/6052
(Continued)

(56) References Cited

U.S. PATENT DOCUMENTS

2005/0160184 A1* 7/2005 Walsh ................. H04L 12/1868
                                              709/247
2010/0177693 A1* 7/2010 Ryu ........................ H04L 69/04
                                              370/328

FOREIGN PATENT DOCUMENTS

CN        1894922       1/2007
CN      101069401      11/2007
(Continued)

OTHER PUBLICATIONS

International Search Report for PCT/CN2014/079546, dated Aug. 1, 2014, 4 pages.

*Primary Examiner* — Chi Tang P Cheng
(74) *Attorney, Agent, or Firm* — Nixon & Vanderhey P.C.

(57) ABSTRACT

A state transition method and apparatus based on ROHC, and a computer storage medium are disclosed. The method comprises: when a state machine of a compressor is in an IR state, transiting a state of the state machine to an FO state when a decompressor can only successfully parse a static field of a service stream packet header; and transiting a state of the state machine to an SO state when the decompressor can successfully parse the static field and a dynamic field; when the state machine is in the FO state, transiting a state of the state machine of the compressor to the SO state when the decompressor can successfully parse the dynamic field; and when the state machine is in the SO state, transiting a state of the state machine to the FO state when the decompressor fails to parse the dynamic field within a preset time threshold.

16 Claims, 6 Drawing Sheets

(52) U.S. Cl.
CPC ........ *H03M 7/6052* (2013.01); *H04L 69/161* (2013.01); *H04L 69/22* (2013.01)

(58) Field of Classification Search
USPC ........................................................ 370/392
See application file for complete search history.

(56) References Cited

FOREIGN PATENT DOCUMENTS

| | | |
|---|---|---|
| WO | WO 02/28107 | 4/2002 |
| WO | WO 2013/052136 | 4/2013 |

\* cited by examiner

Transits a state of the state machine of the compressor from an IR state to a FO state when it is determined that the state machine of the compressor is in an IR state and it is learned that a decompressor corresponding to the compressor can only successfully parse a static field of a service stream packet header; and transits a state of the state machine of the compressor from the IR state to a SO state when it is determined that the state machine of the compressor is in the IR state and it is learned that the decompressor corresponding to the compressor can successfully parse the static field and a dynamic field of the service stream packet header

32

Transits a state of the state machine of the compressor from the FO state to the SO state when it is determined that the state machine of the compressor is in the FO state, and when it is learned that the decompressor corresponding to the compressor can successfully parse the dynamic field of the service stream packet header

33

Transits a state of the state machine of the compressor from the SO state to the FO state when it is determined that the state machine of the compressor is in the SO state, and when it is learned that the decompressor corresponding to the compressor fails to parse the dynamic field of the service stream packet header within a preset time threshold

STATE TRANSITION METHOD AND APPARATUS BASED ON ROHC, AND STORAGE MEDIUM

This application is the U.S. national phase of International Application No. PCT/CN2014/079546 filed 9 Jun. 2014, which designated the U.S. and claims priority to CN Patent Application No. 201310576477.X filed 15 Nov. 2013, the entire contents of each of which are hereby incorporated by reference.

TECHNICAL FIELD

The present disclosure relates to wireless communication technologies based on Robust Header Compression (ROHC) Protocol, and more particularly, to a state transition method and apparatus based on ROHC, and a computer storage medium.

BACKGROUND

Generally, packet header information is divided by ROHC into two parts including a static field and a dynamic field. The static field refers to a rarely changing or almost unchanging field in a service stream packet header; and the dynamic field refers to a frequently changing field in the service stream packet header.

A header Compression Technology is embodied as data interaction between a state machine of a compressor and a state machine of a decompressor.

Figure 1:
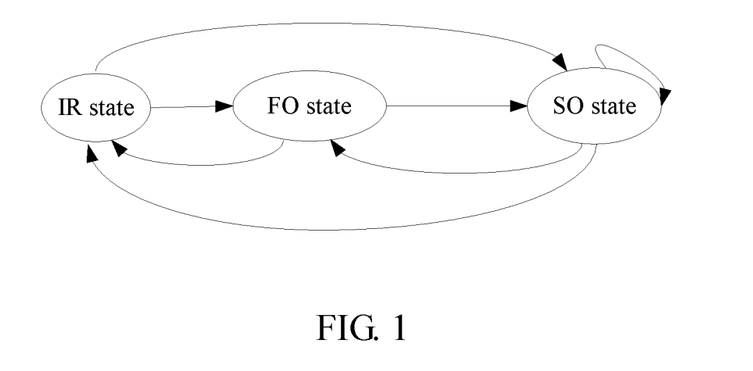
FIG. 1 is a schematic diagram in implementation showing state transition of a state machine of a compressor.

States of the state machine of the compressor include three states: an Initialization and Refresh (IR) state, a First Order (FO) state, and a Second Order (SO) state. FIG. 1 is a schematic diagram in implementation showing state transition of a state machine of a compressor; as shown in FIG. 1, in the IR state, the compressor sends packet header information to a decompressor by way of non-compress; the state machine of the compressor transits from the IR state to the FO state when the compressor learns that the decompressor successfully parses a static field of a packet header; and the state machine of the compressor transits from the IR state to the SO state when the compressor learns that the decompressor successfully parses the static field and a dynamic field of the packet header. When the state machine of the compressor is in the SO state and after the compressor learns that the decompressor fails in parsing the dynamic field of the packet header, the state machine of the compressor transits from the SO state to the FO state; and the state machine of the compressor transits from the SO state to the IR state when the compressor learns that the decompressor fails in parsing both the static field and the dynamic field of the packet header. When the state machine of the compressor is in the FO state and after the compressor learns that the decompressor fails in parsing the static field of the packet header, the state machine of the compressor transits from the FO state to the IR state. When the state transits back to the IR state, the state machine of the compressor returns to an initial state, and the compressor sends a packet to the decompressor again.

Figure 2:
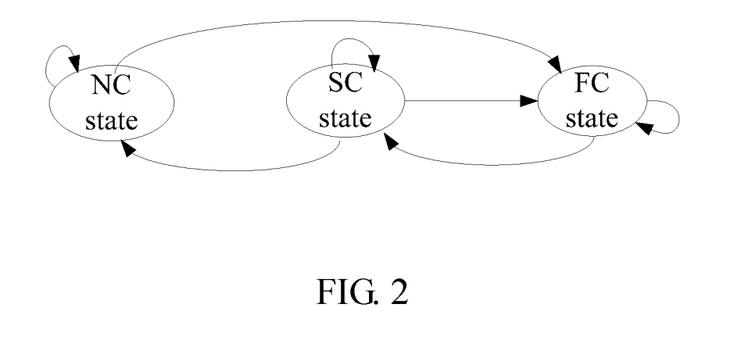
FIG. 2 is a schematic diagram in implementation showing state transition of a state machine of a decompressor.

States of the state machine of the decompressor also include three states: a No Context (NC) state, a Static Context (SC) state and a Full Context (FC) state. FIG. 2 is a schematic diagram in implementation showing state transition of a state machine of a decompressor; as shown in FIG. 2, the state machine of the decompressor is in the NC state during initial work, and the state machine of the decompressor transits from the NC state to the FC state after a decompressor end receives a packet sent by the compressor and both a static field and a dynamic field of the packet header of the packet are successfully parsed; otherwise, the state machine of the decompressor maintains in the NC state. The state machine of the decompressor transits from the FC state to the SC state when the state machine of the decompressor is in the FC state and number of failures of the decompressor in parsing the dynamic field of the packet header exceeds a preset threshold value; otherwise the state machine of the decompressor maintains in the FC state. The state machine of the decompressor transits to the FC state when the state machine of the decompressor is in the SC state and the decompressor successfully parses the dynamic field of the packet header; the state machine of the decompressor transits to the NC state when number of failures of the decompressor in parsing the dynamic field of the packet header exceeds a preset threshold value; and when the state machine of the decompressor transits back to the NC state, the decompressor returns to an initial state and performs state transition on a next packet according to decompression situations of packets.

It can be seen form above that the state machine of the compressor and the state machine of the decompressor need to frequently transit among different states according to packet decompression situations. Consequently, number of transition is increased, and processing speed and processing efficiency of state machine resources are lowered.

SUMMARY

In order to solve existing technical problems, embodiments of the present disclosure provide a state transition method and apparatus based on ROHC, and a computer storage medium, which may reduce number of transition among states, reduce transition frequency, and improve resource processing speed and accelerate processing efficiency.

Technical solutions of embodiments of the present disclosure are implemented as below.

Embodiments of the present disclosure provide a state transition method based on ROHC, which is applied in a state machine of a compressor, including:

when it is determined that the state machine of the compressor is in an Initialization and Refresh (IR) state, transiting a state of the state machine of the compressor from the IR state to a First Order (FO) state when it is learned that a decompressor corresponding to the compressor can only successfully parse a static field of a service stream packet header; and transiting a state of the state machine of the compressor from the IR state to a Second Order (SO) state when it is learned that the decompressor corresponding to the compressor can successfully parse the static field and a dynamic field of the service stream packet header;

when it is determined that the state machine of the compressor is in the FO state, transiting a state of the state machine of the compressor from the FO state to the SO state when it is learned that the decompressor corresponding to the compressor can successfully parse the dynamic field of the service stream packet header; and when it is determined that the state machine of the compressor is in the SO state, transiting a state of the state machine of the compressor from the SO state to the FO state when it is learned that the decompressor corresponding to the compressor fails to parse the dynamic field of the service stream packet header within a preset time threshold.

In the above solution, the method further includes:

stopping transiting a state of the state machine of the compressor when it is determined that the state machine of the compressor is in the SO state and it is learned that the decompressor successfully parses the static field and the dynamic field of the service stream packet header within the preset time threshold.

In the above solution, the method further includes:

transiting a state of the state machine of the decompressor to a Full Context FC state when it is determined that the state machine of the decompressor is in a No Context NC state and the static field and the dynamic field of the packet header are successfully parsed;

transiting a state of the state machine of the decompressor to a Static Context SC state when it is determined that the state machine of the decompressor is in the FC state and the dynamic field of the packet header is failed in parsing and a preset condition is met; and transiting a state of the state machine of the decompressor to the FC state when it is determined that the state machine of the decompressor is in the SC state and the dynamic field of the packet header is successfully parsed.

In the above solution, the method further includes:

stopping transiting a state of the state machine of the decompressor when it is determined that the state machine of the decompressor is in the SC state and the dynamic field of the packet header is failed in parsing.

In the above solution, the method further includes:

stopping transiting a state of the state machine of the decompressor when it is determined that the state machine of the decompressor is in the FC state and the static field and the dynamic field of the packet header are successfully parsed.

Embodiments of the present disclosure further provide a state transition method based on ROHC, which is applied in a state machine of a decompressor, including:

transiting a state of the state machine of the decompressor to a Full Context (FC) state when it is determined that the state machine of the decompressor is in a No Context (NC) state and a static field and a dynamic field of a packet header are successfully parsed;

transiting a state of the state machine of the decompressor to a Static Context (SC) state when it is determined that the state machine of the decompressor is in the FC state and the dynamic field of the packet header is failed in parsing and a preset condition is met; and transiting a state of the state machine of the decompressor to the FC state when it is determined that the state machine of the decompressor is in the SC state and the dynamic field of the packet header is successfully parsed.

In the above solution, the method further includes:

stopping transiting a state of the state machine of the decompressor when it is determined that the state machine of the decompressor is in the SC state and the dynamic field of the packet header is failed in parsing.

In the above solution, the method further includes:

stopping transiting a state of the state machine of the decompressor when it is determined that the state machine of the decompressor is in the FC state and the static field and the dynamic field of the packet header are successfully parsed.

Embodiments of the present disclosure further provide a state transition apparatus based on ROHC, which is applied in a state machine of a compressor, including: a first deter-mining and learning unit, a first transition unit, a second determining and learning unit, a second transition unit, a third determining and learning unit, a third transition unit, a fourth determining and learning unit and a fourth transition unit, where the first determining and learning unit is configured to trigger the first transition unit when it is determined that the state machine of the compressor is in an Initialization and Refresh (IR) state and it is learned that a decompressor corresponding to the compressor can only successfully parse a static field of a service stream packet header;

the first transition unit is configured to transit a state of the state machine of the compressor from the IR state to a First Order (FO) state;

the second determining and learning unit is configured to trigger the second transition unit when it is determined that the state machine of the compressor is in the IR state and it is learned that the decompressor corresponding to the compressor can successfully parse the static field and a dynamic field of the service stream packet header;

the second transition unit is configured to transit a state of the state machine of the compressor from the IR state to a Second Order (SO) state;

the third determining and learning unit is configured to trigger the third transition unit when it is determined that the state machine of the compressor is in the FO state and it is learned that the decompressor corresponding to the compressor can successfully parse the dynamic field of the service stream packet header;

the third transition unit is configured to transit a state of the state machine of the compressor from the FO state to the SO state;

the fourth determining and learning unit is configured to trigger the fourth transition unit when it is determined that the state machine of the compressor is in the SO state and it is learned that the decompressor corresponding to the compressor fails to parse the dynamic field of the service stream packet header within a preset time threshold; and the fourth transition unit is configured to transit a state of the state machine of the compressor from the SO state to the FO state.

In the above solution, the fourth determining and learning unit is further configured to inform the fourth transition unit not to perform state transition when it is determined that the state machine of the compressor is in the SO state and it is learned that the decompressor successfully parses the static field and the dynamic field of the service stream packet header within the preset time threshold.

In the above solution, the apparatus further includes: a first determining and parsing unit, a fifth transition unit, a second determining and parsing unit, a sixth transition unit, a third determining and parsing unit and a seventh transition unit, where the first determining and parsing unit is configured to trigger the fifth transition unit when it is determined that the state machine of the decompressor corresponding to the compressor is in a No Context (NC) state and the static field and the dynamic field of the packet header are successfully parsed;

the fifth transition unit is configured to transit a state of the state machine of the decompressor to a Full Context (FC) state;

the second determining and parsing unit is configured to trigger the sixth transition unit when it is determined that the state machine of the decompressor is in the FC state and the dynamic field of the packet header is failed in parsing and a preset condition is met;

the sixth transition unit is configured to transit a state of the state machine of the decompressor to a Static Context (SC) state;

the third determining and parsing unit is configured to trigger the seventh transition unit when it is determined that the state machine of the decompressor is in the SC state and the dynamic field of the packet header is successfully parsed; and the seventh transition unit is configured to transit a state of the state machine of the decompressor to the FC state.

In the above solution, the third determining and parsing unit is further configured to inform the seventh transition unit not to perform state transition when it is determined that the state machine of the decompressor is in the SC state and the dynamic field of the packet header is failed in parsing.

In the above solution, the second determining and parsing unit is further configured to inform the sixth transition unit not to perform state transition when it is determined that the state machine of the decompressor is in the FC state and the static field and the dynamic field of the packet header are successfully parsed.

Embodiments of the present disclosure further provide a state transition apparatus based on ROHC, which is applied in a state machine of a decompressor, including: a first determining and parsing unit, a fifth transition unit, a second determining and parsing unit, a sixth transition unit, a third determining and parsing unit and a seventh transition unit, where the first determining and parsing unit is configured to trigger the fifth transition unit when it is determined that the state machine of the decompressor is in a No Context (NC) state and a static field and a dynamic field of a packet header are successfully parsed;

the fifth transition unit is configured to transit a state of the state machine of the decompressor to a Full Context (FC) state;

the second determining and parsing unit is configured to trigger the sixth transition unit when it is determined that the state machine of the decompressor is in the FC state and the dynamic field of the packet header is failed in parsing and a preset condition is met;

the sixth transition unit is configured to transit a state of the state machine of the decompressor to a Static Context (SC) state;

the third determining and parsing unit is configured to trigger the seventh transition unit when it is determined that the state machine of the decompressor is in the SC state and the dynamic field of the packet header is successfully parsed; and the seventh transition unit is configured to transit a state of the state machine of the decompressor to the FC state.

In the above solution, the third determining and parsing unit is further configured to inform the seventh transition unit not to perform state transition when it is determined that the state machine of the decompressor is in the SC state and the dynamic field of the packet header is failed in parsing.

In the above solution, the second determining and parsing unit is further configured to inform the sixth transition unit not to perform state transition when it is determined that the state machine of the decompressor is in the FC state and the static field and the dynamic field of the packet header are successfully parsed.

Embodiments of the present disclosure further provide a computer storage medium, in which a first set of computer-executable instructions are stored, where the first set of computer-executable instructions are configured to execute the foregoing state transition method based on ROHC, which is applied in a state machine of a compressor.

Embodiments of the present disclosure further provide a computer storage medium, in which a second set of computer-executable instructions are stored, where the second set of computer-executable instructions are configured to execute the foregoing state transition method based on ROHC, which is applied in a state machine of a decompressor.

Embodiments of the present disclosure provide a state transition method and apparatus based on ROHC, and a computer storage medium. The method includes: when it is determined that a state machine of a compressor is in an Initialization and Refresh (IR) state, transiting a state of the state machine of the compressor from the IR state to a First Order (FO) state when it is learned that a decompressor corresponding to the compressor can only successfully parse a static field of a service stream packet header; and transiting a state of the state machine of the compressor from the IR state to a Second Order (SO) state when it is learned that the decompressor corresponding to the compressor can successfully parse the static field and a dynamic field of the service stream packet header; when it is determined that the state machine of the compressor is in the FO state, transiting a state of the state machine of the compressor from the FO state to the SO state when it is learned that the decompressor corresponding to the compressor can successfully parse the dynamic field of the service stream packet header; and when it is determined that the state machine of the compressor is in the SO state, transiting a state of the state machine of the compressor from the SO state to the FO state when it is learned that the decompressor corresponding to the compressor fails to parse the dynamic field of the service stream packet header within a preset time threshold. Technical solutions recorded in embodiments of the present disclosure fully utilize a characteristic that static field information of all packet headers having a same Context ID is identical, so that it is regarded by default that static fields of packet headers of subsequently transmitted packets are successfully parsed after a static field of a packet header of one packet is successfully parsed at a decompressor end. It is neither needed to transit from an SO state or an FO state to an IR state nor needed to transit from an SC state to an NC state by utilizing technical solutions of embodiments of the present disclosure, thereby reducing number of transition among states, reducing transition frequency, improving resource processing speed, and accelerating resource processing efficiency.

DETAILED DESCRIPTION OF EMBODIMENTS

In Robust Header Compression 3095 (RFC 3095) Protocol, when multiple ROHC packet service streams are transmitted in a same channel, each service stream has a unique Context Identity (Context ID) at a sending end (a compressor) and a receiving end (a decompressor) for identifying the service stream; meanwhile, static field information of all packet headers in the service stream identifying a same Context ID is identical. Therefore, this characteristic is fully utilized in subsequent technical solutions of embodiments of the present disclosure.

Figure 3:
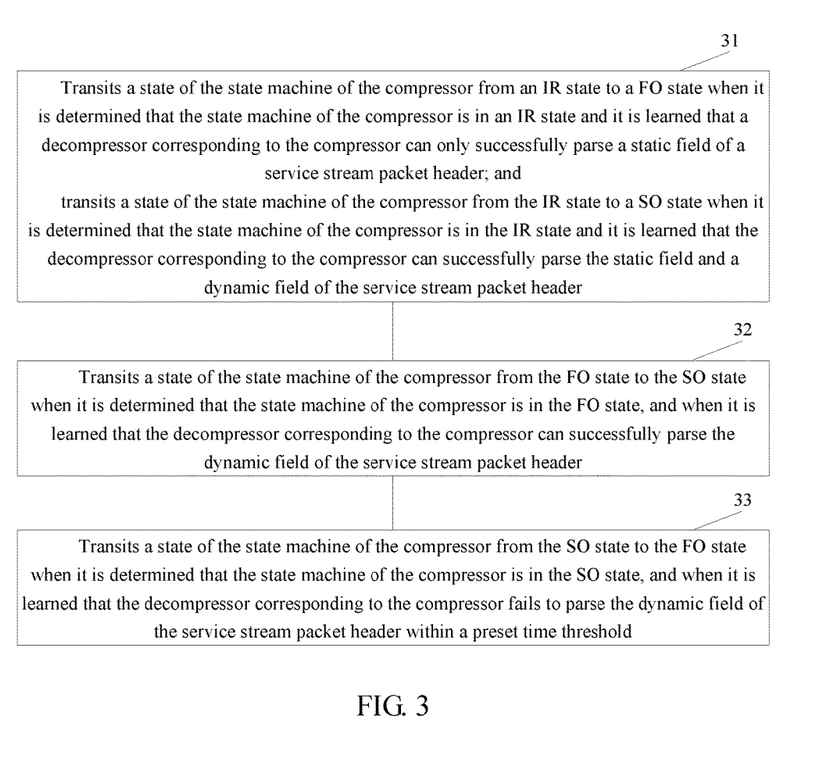
FIG. 3 is a schematic diagram showing an implementation process of a state transition method based on ROHC according to embodiments of the present disclosure.

Embodiments of the present disclosure record a state transition method based on ROHC, which is applied in a state machine of a compressor, as shown in FIG. 3, the method includes following steps Step 31 to Step 33.

In Step 31, transits a state of the state machine of the compressor from an Initialization and Refresh (IR) state to a First Order (FO) state when it is determined that the state machine of the compressor is in an IR state and it is learned that a decompressor corresponding to the compressor can only successfully parse a static field of a service stream packet header; and transits a state of the state machine of the compressor from the IR state to a Second Order (SO) state when it is determined that the state machine of the compressor is in the IR state and it is learned that the decompressor corresponding to the compressor can successfully parse the static field and a dynamic field of the service stream packet header;

in Step 32, transits a state of the state machine of the compressor from the FO state to the SO state when it is determined that the state machine of the compressor is in the FO state and it is learned that the decompressor corresponding to the compressor can successfully parse the dynamic field of the service stream packet header; and in Step 33, transits a state of the state machine of the compressor from the SO state to the FO state when it is determined that the state machine of the compressor is in the SO state and it is learned that the decompressor corresponding to the compressor fails to parse the dynamic field of the service stream packet header within a preset time threshold.

In Step 33, maintains the state machine of the compressor in the SO state and stops transiting a state of the state machine of the compressor when the state machine of the compressor is in the SO state and it is learned that the decompressor successfully parses the static field and the dynamic field of the service stream packet header within the preset time threshold.

In embodiments of the present disclosure, header compression includes three working modes: a unidirectional mode (U mode), an optimal mode (O mode) and a reliable mode (R mode). In different modes, manners of the compressor for learning whether decompression of the decompressor is successful or not are different, specifically referring to communication mechanism descriptions of the compressor and the decompressor during header compression, which is not unnecessarily described in embodiments of the present disclosure.

The compressor sends a service stream to the decompressor. Transits, at a decompressor end, a state of the state machine of the decompressor to an FC state when it is determined that the state machine of the decompressor is in an NC state, and a static field and a dynamic field of a packet header are successfully parsed; otherwise, maintains the state machine of the decompressor in the NC state, and stops transiting a state of the state machine of the decompressor.

Transits a state of the state machine of the decompressor to an SC state when it is determined that the state machine of the decompressor is in the FC state and the dynamic field of the packet header is failed in parsing and a preset condition is met;

where the preset condition includes: number of failures of the decompressor in parsing the dynamic field of the packet header meets a preset threshold value.

Maintains the state machine of the decompressor in the FC state and stops transiting a state of the state machine of the decompressor when the state machine of the decompressor is in the FC state and the static field and the dynamic field of the packet header are successfully parsed;

transits a state of the state machine of the decompressor to the FC state when it is determined that the state machine of the decompressor is in the SC state and the dynamic field of the packet header is successfully parsed; and maintains the state machine of the decompressor in the SC state and stops transiting a state of the state machine of the decompressor when it is determined that the state machine of the decompressor is in the SC state and the dynamic field of the packet header is failed in parsing.

Figure 4:
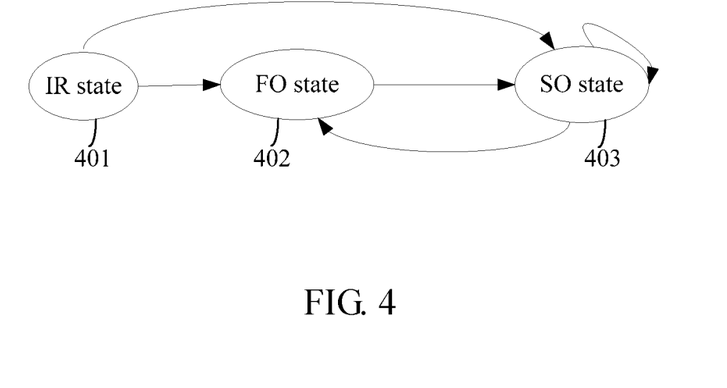
FIG. 4 is a schematic diagram showing state transition of a state machine of a compressor according to embodiments of the present disclosure.

FIG. 4 is a schematic diagram showing state transition of a state machine of a compressor according to an embodiment of the present disclosure, as shown in FIG. 4, this embodiment includes following steps Step 401 to Step 403.

In Step 401, the compressor determines that its own state machine is working in an IR state, and the compressor sends the decompressor a packet (current packet) of which a Context ID is A when the compressor is in an IR state. Here, static field information of packets having a same Context ID is identical.

Transits the state machine of the compressor from the IR state to the FO state and continues to process Step 402 when the compressor learns that the decompressor successfully parses a static field of a packet header of the current packet; and Transits the state machine of the compressor from the IR state to the SO state and continues to process Step 403 when the compressor learns that the decompressor successfully parses the static field and a dynamic field of a current packet header.

In Step 402, the compressor sends the decompressor other selected packets having a Context ID as same as that of the current packet and carrying dynamic fields of packet headers when the compressor determines that its own state machine is in the FO state; and transits the state machine of the compressor from the FO state to the SO state and continues to process Step 403 when it is learned that the decompressor successfully parses the dynamic fields of the packet headers of the other packets.

In Step 403, the compressor determines that its own state machine is in the SO state, the compressor sends the decompressor other selected packets having a Context ID as same as that of the current packet and carrying dynamic fields of packet headers;

transits the state machine of the compressor to the FO state and continues to process Step 402 when it is learned that the decompressor fails to parse the dynamic fields of the packet headers of the other packets within a preset time threshold; and continues to execute Step 403 when it is learned that the decompressor successfully parses static fields and dynamic fields of the other packets within the time threshold.

It can be seen from above that, in subsequent packet transmission, a state of the state machine of the compressor is only switched between the SO state and the FO state, and is not needed to transit from the SO state or the FO state to the IR state.

In embodiments of the present disclosure, since static field information of packets having a same Context ID is identical, it is regarded that static fields of packet headers of other packets having a Context ID as same as that of the current packet can also be successfully parsed by the decompressor when the compressor learns that the decompressor successfully parses the static field of the packet header of the current packet of which a Context ID is A, so that a link of transiting the SO state or the FO state to the IR state is omitted, number of transition among states is reduced, transition frequency is decreased, and resource processing speed of the compressor is improved.

Figure 5:
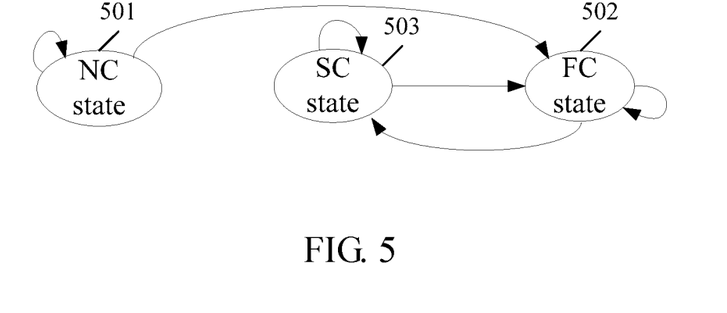
FIG. 5 is a schematic diagram showing state transition of a state machine of a decompressor according to embodiments of the present disclosure.

FIG. 5 is a schematic diagram showing state transition of a state machine of a decompressor according to embodiments of the present disclosure, as shown in FIG. 5, this embodiment includes following steps Step 501 to Step 503.

In Step 501, the decompressor determines that its own state machine initially works in the NC state, the decompressor receives the current packet, of which a Context ID is A, sent by the compressor when the decompressor is in the NC state;

transits the state machine of the decompressor from the NC state to the FC state and continues to process Step 502 when a static field and a dynamic field of a packet header of a packet are successfully parsed; and continues to execute Step 501 when the static field and the dynamic field of the packet header of the packet are failed in parsing.

In Step 502, transits a state of the state machine from the FC state to the SC state and continues to execute Step 503 when the decompressor determines that its own state machine is in the FC state and number of failures in parsing the dynamic fields of the packet headers of the other packets meets a preset threshold value; and continues to execute Step 502 when the dynamic fields of the packet headers of the other packets are successfully parsed.

In this step, the decompressor deems by default that static fields of packet headers of the other packets are successfully parsed since static field information of packets having a same Context ID is identical and the current packet of which a Context ID is A has been successfully parsed.

In Step 503, transits a state of the state machine from the SC state to the FC state and continues to execute Step 502 when the decompressor determines that its own state machine is in the SC state and the decompressor successfully parses the other packets carrying dynamic fields sent by the compressor; and continues to execute Step 503 when the decompressor fails in parsing the dynamic fields of the other packets.

It can be seen from above that, in subsequent packet transmission, a state of the state machine of the decompressor will be switched between the SC state and the FC state, and is not needed to transit from the SC state to the NC state. At a decompressor end, a link of transiting from the SC state to the NC state is omitted, number of transition among states is reduced, transition frequency is decreased, and resource processing speed of the decompressor is improved.

Embodiments of the present disclosure further provide a first kind of computer storage medium, in which a first set of computer-executable instructions are stored, where the first set of computer-executable instructions are configured to execute the foregoing state transition method based on ROHC, which is applied in a state machine of a compressor.

Embodiments of the present disclosure further provide a second kind of computer storage medium, in which a second set of computer-executable instructions are stored, where the second set of computer-executable instructions are configured to execute foregoing state transition method based on ROHC, which is applied in a state machine of a decompressor.

Figure 6A:
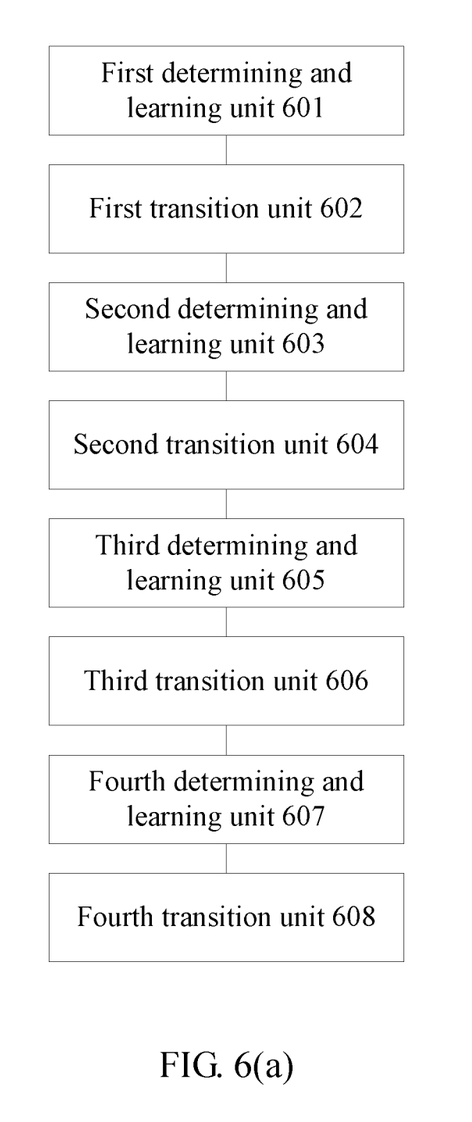
FIG. 6(a) and FIG. 6(b) are schematic diagrams showing compositions and structures of a state transition apparatus based on ROHC according to embodiments of the present disclosure.

Based on the foregoing state transition method, embodiments of the present disclosure further record a state transition apparatus based on ROHC, which is applied in a state machine of a compressor, as shown in FIG. 6(a), the apparatus includes: a first determining and learning unit 601, a first transition unit 602, a second determining and learning unit 603, a second transition unit 604, a third determining and learning unit 605, a third transition unit 606, a fourth determining and learning unit 607 and a fourth transition unit 608, where the first determining and learning unit 601 is configured to trigger the first transition unit 602 when it is determined that the state machine of the compressor is in an IR state and it is learned that a decompressor corresponding to the compressor can only successfully parse a static field of a service stream packet header;

the first transition unit 602 is configured to transit a state of the state machine of the compressor from the IR state to a First Order (FO) state;

the second determining and learning unit 603 is configured to trigger the second transition unit 604 when it is determined that the state machine of the compressor is in the IR state and it is learned that the decompressor corresponding to the compressor can successfully parse the static field and a dynamic field of the service stream packet header;

the second transition unit 604 is configured to transit a state of the state machine of the compressor from the IR state to a Second-Order (SO) state;

the third determining and learning unit 605 is configured to trigger the third transition unit 606 when it is determined that the state machine of the compressor is in an FO state and it is learned that the decompressor corresponding to the compressor can successfully parse the dynamic field of the service stream packet header;

the third transition unit 606 is configured to transit a state of the state machine of the compressor from the FO state to the SO state;

the fourth determining and learning unit 607 is configured to trigger the fourth transition unit 608 when it is determined that the state machine of the compressor is in the SO state and it is learned that the decompressor corresponding to the compressor fails to parse the dynamic field of the service stream packet header within a preset time threshold; and the fourth transition unit 608 is configured to transit a state of the state machine of the compressor from the SO state to the FO state.

The fourth determining and learning unit 607 is further configured to inform the fourth transition unit 608 not to perform state transition when it is determined that the state machine of the compressor is in the SO state and it is learned that the decompressor successfully parses the static field and the dynamic field of the service stream packet header within the preset time threshold.

Figure 6B:
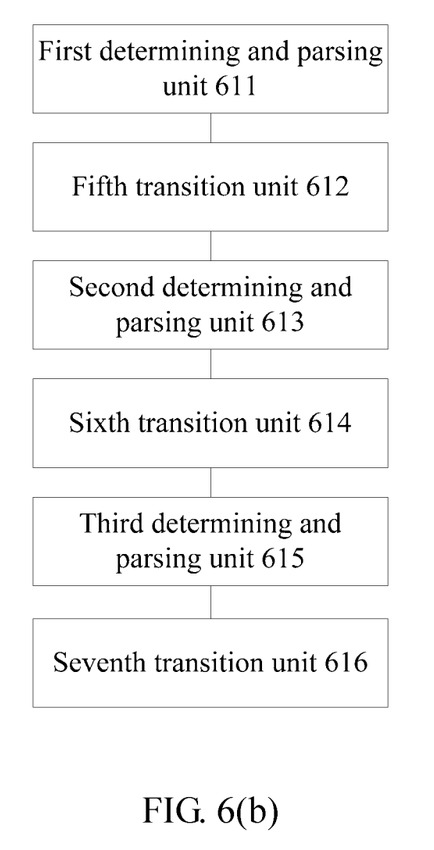

On a basis of the apparatus as shown in FIG. 6(a), as shown in FIG. 6(b), the apparatus further includes: a first determining and parsing unit 611, a fifth transition unit 612, a second determining and parsing unit 613, a sixth transition unit 614, a third determining and parsing unit 615 and a seventh transition unit 616, where the first determining and parsing unit 611 is configured to trigger the fifth transition unit 612 when it is determined that the state machine of the decompressor corresponding to the compressor is in an NC state and the static field and the dynamic field of the packet header are successfully parsed;

the fifth transition unit 612 is configured to transit a state of the state machine of the decompressor to an FC state;

the second determining and parsing unit 613 is configured to trigger the sixth transition unit 614 when it is determined that the state machine of the decompressor is in the FC state and the dynamic field of the packet header is failed in parsing and a preset condition is met;

the sixth transition unit 614 is configured to transit a state of the state machine of the decompressor to an SC state;

the third determining and parsing unit 615 is configured to trigger the seventh transition unit 616 when it is determined that the state machine of the decompressor is in the SC state and the dynamic field of the packet header is successfully parsed; and the seventh transition unit 616 is configured to transit a state of the state machine of the decompressor to the FC state.

The third determining and parsing unit 615 is further configured to inform the seventh transition unit 616 not to perform state transition when it is determined that the state machine of the decompressor is in the SC state and the dynamic field of the packet header is failed in parsing.

The second determining and parsing unit 613 is further configured to inform the sixth transition unit 614 not to perform state transition when it is determined that the state machine of the decompressor is in the FC state and the static field and the dynamic field of the packet header are successfully parsed.

The preset condition includes: number of failures in parsing the dynamic field of the packet header meets a preset threshold value.

Figure 7:
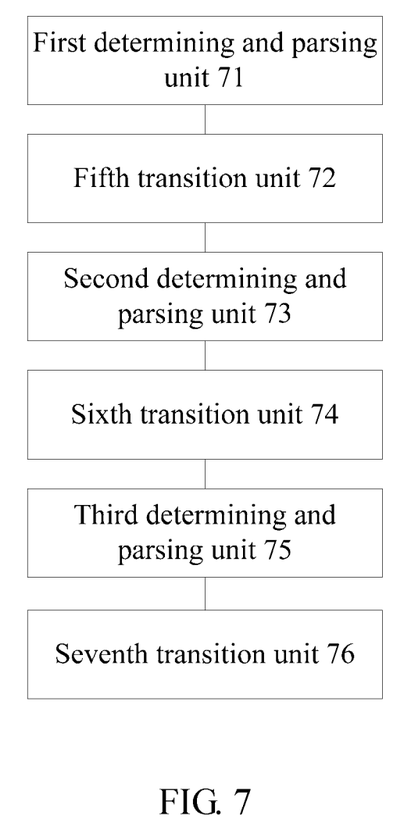
FIG. 7 is another schematic diagram showing compositions and structures of a state transition apparatus based on ROHC according to embodiments of the present disclosure.

Meanwhile, embodiments of the present disclosure further record a state transition apparatus based on ROHC, which is applied in a state machine of a decompressor, as shown in FIG. 7, the apparatus includes: a first determining and parsing unit 71, a fifth transition unit 72, a second determining and parsing unit 73, a sixth transition unit 74, a third determining and parsing unit 75 and a seventh transition unit 76, where the first determining and parsing unit 71 is configured to trigger the fifth transition unit 72 when it is determined that the state machine of the decompressor corresponding to the compressor is in a NC state and the static field and the dynamic field of a packet header are successfully parsed;

the fifth transition unit 72 is configured to transit a state of the state machine of the decompressor to an FC state;

the second determining and parsing unit 73 is configured to trigger the sixth transition unit 74 when it is determined that the state machine of the decompressor is in the FC state and the dynamic field of the packet header is failed in parsing and a preset condition is met;

the sixth transition unit 74 is configured to transit a state of the state machine of the decompressor to an SC state;

the third determining and parsing unit 75 is configured to trigger the seventh transition unit 76 when it is determined that the state machine of the decompressor is in the SC state and the dynamic field of the packet header is successfully parsed; and the seventh transition unit 76 is configured to transit a state of the state machine of the decompressor to the FC state.

The third determining and parsing unit 75 is further configured to inform the seventh transition unit 76 not to perform state transition when it is determined that the state machine of the decompressor is in the SC state and the dynamic field of the packet header is failed in parsing.

The second determining and parsing unit 73 is further configured to inform the sixth transition unit 74 not to perform state transition when it is determined that the state machine of the decompressor is in the FC state and the static field and the dynamic field of the packet header are successfully parsed.

The preset condition includes: number of failures in parsing the dynamic field of the packet header meets a preset threshold value.

In practical application, the first determining and learning unit 601, the first transition unit 602, the second determining and learning unit 603, the second transition unit 604, the third determining and learning unit 605, the third transition unit 606, the fourth determining and learning unit 607 and the fourth transition unit 608 each may be implemented by a central processing unit (CPU), or a digital signal processor (DSP), or a micro processor unit (MPU), or a field programmable gate array (FPGA) and the like; and the CPU, the DSP, the MPU and the FPGA each may be arranged in the compressor, specifically, the state machine of the compressor.

In practical application, the first determining and parsing unit 611, the fifth transition unit 612, the second determining and parsing unit 613, the sixth transition unit 614, the third determining and parsing unit 615, the seventh transition unit 616, the first determining and parsing unit 71, the fifth transition unit 72, the second determining and parsing unit 73, the sixth transition unit 74, the third determining and parsing unit 75 and the seventh transition unit 76 each may be implemented by a CPU, or a DSP, or an MPU or an FPGA and the like; and the CPU, the DSP, the MPU and the FPGA each may be arranged in the decompressor, specifically, the state machine of the decompressor.

Persons skilled in the art should understand that implementation functions of various processing units in the state transition apparatus based on ROHC as shown in FIG. 6(a), FIG. 6(b) and FIG. 7 may be understood by referring to related description of the foregoing state transition method based on ROHC. Persons skilled in the art should understand that functions of various processing units in the state transition apparatus based on ROHC as shown in FIG. 6(a), FIG. 6(b) and FIG. 7 may be implemented by programs running on processors, and may also be implemented by specific logic circuits.

The state transition method and apparatus based on ROHC and the computer storage medium provided by embodiments of the present disclosure utilize a characteristic that static field information of all packet headers having a same Context ID is identical, so that it is regarded by default that static fields of packet headers of subsequently transmitted packets are successfully parsed as long as a static field of a packet header of one packet can be successfully parsed at a decompressor end. Compared with an existing art. It is neither needed to transit from an SO state or an FO state to an IR state nor needed to transit from an SC state to an NC state by utilizing technical solutions of embodiments of the present disclosure, thereby reducing number of transition among states, reducing transition frequency, and improving resource processing speed.

Those skilled in the art should realize that the embodiments of the present disclosure may be provided as a method, a system or a computer program product. Therefore, the present disclosure may use forms of a hardware embodiment, a software embodiment, or an embodiment in combination of software and hardware aspects. Furthermore, the present disclosure may use forms of computer program products implemented on one or more computer storage media (including but not limited to a magnetic disk memory, an optical memory or the like) which includes a computer program code.

The present disclosure is described with reference to flowcharts and/or block diagrams according to the method, equipment (system) and a computer program product of the embodiments of the present disclosure. It is to be understood that each flow and/or block in the flowchart and/or block diagram as well as combination of flow and/or block in the flowchart and/or block diagram may be realized by computer program instructions. These computer program instructions may be provided to a general purpose computer, a special purpose computer, an embedded processor or processors of other programmable data processing equipment so as to generate a machine so that such a device configured to achieve functions designated in one or more flows of the flowchart and/or in one or more blocks of the block diagram is generated by means of instructions executed by computers or processors of other programmable data processing equipment.

These computer program instructions may be stored in a computer-readable memory which can lead a computer or other programmable data processing equipment to work in a particular way so that instructions stored in the computer-readable memory may generate a manufactured product comprising a command device which can achieve functions designated in one or more flows of the flowchart and/or in one or more blocks of the block diagram.

These computer program instructions may also be loaded onto computers or other programmable data processing equipment so that a series of operation steps are executed on the computers or other programmable equipment to generate a processing achieved by computers, thus providing steps for achieving functions designated in one or more flows of the flowchart and/or in one or more blocks of the block diagram by means of instructions executed by computers or other programmable equipment.

The above-mentioned embodiments are merely embodiments of the present disclosure, and are not intended to limit the scope of protection of the present disclosure.

What is claimed is:

1. A state transition method based on Robust Header Compression Protocol (ROHC), which is applied in a state machine of a compressor, comprising:
    transmitting a service stream packet to a decompressor corresponding to the compressor, when it is determined, by the compressor, that the state machine of the compressor is in an Initialization and Refresh IR state,
    transiting a state of the state machine of the compressor from the IR state to a First Order FO state when it is learned from information fed back by the decompressor that the decompressor can only successfully decompress a static field of a service stream packet header; and transiting a state of the state machine of the compressor from the IR state to a Second Order SO state when it is learned from the information fed back by the decompressor that the decompressor corresponding to the compressor can successfully decompress the static field and a dynamic field of the service stream packet header;
    when it is determined, by the compressor, that the state machine of the compressor is in the FO state, transmitting, by the compressor, other service stream packet with the same context identifier (Context ID) as the service stream packet to the decompressor;
    transiting a state of the state machine of the compressor from the FO state to the SO state when it is learned from the information fed back by the decompressor that the decompressor can successfully decompress the dynamic field of the service stream packet header of the other service stream packet with the same Context ID as the service stream packet; and
    when it is determined, by the compressor, that the state machine of the compressor is in the SO state, transmitting, by the compressor, the other service stream packet with the same Context ID as the service stream packet to the decompressor;
    transiting a state of the state machine of the compressor from the SO state to the FO state when it is learned from the information fed back by the decompressor that the decompressor fails to decompress the dynamic field of the service stream packet header of the other service stream packet with the same Context ID as the service stream packet within a preset time threshold; and
    wherein when transmitting, by the compressor, other service stream packet with the same Context ID as the service stream packet to the decompressor, a state of the state machine of the compressor are not transited from the FO state or the SO state to the IR state;
    wherein the static field refers to an unchanging field in a service stream packet header; and the dynamic field refers to a frequently changing field in the service stream packet header.

2. The state transition method based on ROHC according to claim 1, further comprising:
    stopping transiting a state of the state machine of the compressor when it is determined, by the compressor, that the state machine of the compressor is in the SO state and it is learned that the decompressor successfully decompresses the static field and the dynamic field of the service stream packet header within the preset time threshold.

3. The state transition method based on ROHC according to claim 1, further comprising:
    transiting a state of the state machine of the decompressor to a Full Context FC state when it is determined, by the decompressor, that the state machine of the decompressor is in a No Context NC state and the static field and the dynamic field of the packet header of the service stream packet that received from the compressor are successfully decompressed by the decompressor;
    transiting a state of the state machine of the decompressor to a Static Context SC state when it is determined, by the decompressor, that the state machine of the decompressor is in the FC state and the decompressor receives other service stream packet with the same Context ID as the service stream packet, and the dynamic field of the packet header of the other service stream packet with the same Context ID as the service stream packet is failed in decompressing and a preset condition is met; and transiting a state of the state machine of the decompressor to the FC state when it is determined, by the decompressor, that the state machine of the decompressor is in the SC state and the decompressor receives other service stream packet with the same Context ID as the service stream packet, and the dynamic field of the packet header of the other service stream packet with the same Context ID as the service stream packet is successfully decompressed; and wherein when decompressing, by the decompressor, other service stream packet with the same Context ID as the service stream packet, the state machine of the decompressor does not transit its state from the SC state to the NC state;

wherein the preset condition includes: number of failures of the decompressor in decompressing the dynamic field of the packet header meets a preset threshold value.

4. The state transition method based on ROHC according to claim 3, further comprising:

stopping transiting a state of the state machine of the decompressor when it is determined, by the decompressor, that the state machine of the decompressor is in the SC state and the dynamic field of the packet header is failed in decompressing.

5. The state transition method based on ROHC according to claim 4, further comprising:

stopping transiting a state of the state machine of the decompressor when it is determined that the state machine of the decompressor is in the FC state and the static field and the dynamic field of the packet header are successfully decompressed.

6. The state transition method based on ROHC according to claim 3, further comprising:

stopping transiting a state of the state machine of the decompressor when it is determined, by the decompressor, that the state machine of the decompressor is in the FC state and the static field and the dynamic field of the packet header are successfully decompressed.

7. A state transition apparatus based on Robust Header Compression Protocol (ROHC), which is applied in a state machine of a compressor, comprising: a processor and a storage device, a first determining and learning unit, a first transition unit, a second determining and learning unit, a second transition unit, a third determining and learning unit, a third transition unit, a fourth determining and learning unit and a fourth transition unit, wherein the storage device stores processor-executable programs, and the programs comprise a scheduling extension unit and a scheduling unit, wherein the first determining and learning unit is configured to transmit a service stream packet to a decompressor corresponding to the compressor and trigger the first transition unit when it is determined that the state machine of the compressor is in an Initialization and Refresh IR state and it is learned from the information fed back by the decompressor that the decompressor can only successfully decompress a static field of a service stream packet header;

the first transition unit is configured to transit a state of the state machine of the compressor from the IR state to a First Order FO state, when triggered by the first determining and learning unit;

the second determining and learning unit is configured to trigger the second transition unit when it is determined that the state machine of the compressor is in the IR state and it is learned from the information fed back by the decompressor that the decompressor can successfully decompress the static field and a dynamic field of the service stream packet header;

the second transition unit is configured to transit a state of the state machine of the compressor from the IR state to a Second Order SO state, when triggered by the second determining unit;

the third determining and learning unit is configured to trigger the third transition unit when it is determined that the state machine of the compressor is in the FO state and transmits other service stream packet with the same context identifier (Context ID) as the service stream packet to the decompressor, and it is learned from the information fed back by the decompressor that the decompressor can successfully decompress the dynamic field of the service stream packet header of the other service stream packet with the same Context ID as the service stream packet;

the third transition unit is configured to transit a state of the state machine of the compressor from the FO state to the SO state, when triggered by the third determining and learning unit;

the fourth determining and learning unit is configured to trigger the fourth transition unit when it is determined that the state machine of the compressor is in the SO state and transmits the other service stream packet with the same Context ID as the service stream packet to the decompressor, and it is learned from the information fed back by the decompressor that the decompressor fails to decompress the dynamic field of the service stream packet header of the other service stream packet with the same Context ID as the service stream packet within a preset time threshold; and the fourth transition unit is configured to transit a state of the state machine of the compressor from the SO state to the FO state, when triggered by the fourth determining and learning unit;

wherein, when transmitting, by the compressor, other service stream packet with the same context identifier (Context ID) as the service stream packet to the decompressor, the state machine of the compressor does not transit its state from the FO state or the SO state to the IR state;

wherein, the static field refers to an unchanging field in a service stream packet header; and the dynamic field refers to a frequently changing field in the service stream packet header.

8. The state transition apparatus based on ROHC according to claim 7, wherein the fourth determining and learning unit is further configured to inform the fourth transition unit not to perform state transition when it is determined that the state machine of the compressor is in the SO state and it is learned that the decompressor successfully decompresses the static field and the dynamic field of the service stream packet header within the preset time threshold.

9. The state transition apparatus based on ROHC according to claim 7, further comprising: a first determining and parsing unit, a fifth transition unit, a second determining and parsing unit, a sixth transition unit, a third determining and parsing unit and a seventh transition unit, wherein the first determining and parsing unit is configured to trigger the fifth transition unit when it is determined that the state machine of the decompressor corresponding to the compressor is in a No Context NC state and the static field and the dynamic field of the packet header are successfully decompressed;

the fifth transition unit is configured to transit a state of the state machine of the decompressor to a Full Context FC state, when triggered by the first determining and parsing unit;

the second determining and parsing unit is configured to trigger the sixth transition unit when it is determined that the state machine of the decompressor is in the FC state and the dynamic field of the packet header is failed in decompressing and a preset condition is met;

the sixth transition unit is configured to transit a state of the state machine of the decompressor to a Static Context SC state, when triggered by the second determining and parsing unit;

the third determining and parsing unit is configured to trigger the seventh transition unit when it is determined that the state machine of the decompressor is in the SC state and the dynamic field of the packet header is successfully decompressed;

the seventh transition unit is configured to transit a state of the state machine of the decompressor to the FC state, when triggered by the third determining and parsing unit; and the preset condition comprises: number of failures of the decompressor in decompressing the dynamic field of the packet header meets a preset threshold value.

10. The state transition apparatus based on ROHC according to claim 9, wherein the third determining and parsing unit is further configured to inform the seventh transition unit not to perform state transition when it is determined that the state machine of the decompressor is in the SC state and the dynamic field of the packet header is failed in decompressing.

11. The state transition apparatus based on ROHC according to claim 10, wherein
the second determining and parsing unit is further configured to inform the sixth transition unit not to perform state transition when it is determined that the state machine of the decompressor is in the FC state and the static field and the dynamic field of the packet header are successfully decompressed.

12. The state transition apparatus based on ROHC according to claim 9, wherein
the second determining and parsing unit is further configured to inform the sixth transition unit not to perform state transition when it is determined that the state machine of the decompressor is in the FC state and the static field and the dynamic field of the packet header are successfully decompressed.

13. A state transition apparatus based on Robust Header Compression Protocol (ROHC), which is applied in a state machine of a decompressor, comprising: a processor and a storage device, a first determining and parsing unit, a fifth transition unit, a second determining and parsing unit, a sixth transition unit, a third determining and parsing unit and a seventh transition unit, wherein the storage device stores processor-executable programs, and the programs comprise a scheduling extension unit and a scheduling unit, wherein
the first determining and parsing unit is configured to trigger the fifth transition unit when it is determined that the state machine of the decompressor is in a No Context NC state and a static field and a dynamic field of a packet header of a service stream packet that received from the compressor are successfully decompressed;

the fifth transition unit is configured to transit a state of the state machine of the decompressor to a Full Context FC state, when triggered by the first determining and parsing unit;

the second determining and parsing unit is configured to trigger the sixth transition unit when it is determined that the state machine of the decompressor is in the FC state and the decompressor receives other service stream packet with the same context identifier (Context ID) as the service stream packet, and the dynamic field of the packet header of the other service stream packet with the same Context ID as the service stream packet is failed in decompressing and a preset condition is met;

the sixth transition unit is configured to transit a state of the state machine of the decompressor to a Static Context SC state, when triggered by the second determining and parsing unit;

the third determining and parsing unit is configured to trigger the seventh transition unit when it is determined that the state machine of the decompressor is in the SC state and the decompressor receives other service stream packet with the same Context ID as the service stream packet, and the dynamic field of the packet header is successfully decompressed; and the seventh transition unit is configured to transit a state of the state machine of the decompressor to the FC state, when triggered by the third determining and parsing unit;

wherein, when decompressing, by the decompressor, other service stream packet with the same Context ID as the service stream packet, the state machine of the decompressor does not transit its state from the SC state to the NC state;

wherein, the preset condition includes: number of failures of the decompressor in decompressing the dynamic field of the packet header meets a preset threshold value.

14. The state transition apparatus based on ROHC according to claim 13, wherein the third determining and parsing unit is further configured to inform the seventh transition unit not to perform state transition when it is determined that the state machine of the decompressor is in the SC state and the dynamic field of the packet header is failed in decompressing.

15. The state transition apparatus based on ROHC according to claim 14, wherein
the second determining and parsing unit is further configured to inform the sixth transition unit not to perform state transition when it is determined that the state machine of the decompressor is in the FC state and the static field and the dynamic field of the packet header are successfully decompressed.

16. The state transition apparatus based on ROHC according to claim 13, wherein
the second determining and parsing unit is further configured to inform the sixth transition unit not to perform state transition when it is determined that the state machine of the decompressor is in the FC state and the static field and the dynamic field of the packet header are successfully decompressed.

* * * * *